United States Patent [19]

Ogawa et al.

[11] Patent Number: 5,570,070
[45] Date of Patent: *Oct. 29, 1996

[54] METHOD OF ADJUSTING A FREQUENCY RESPONSE IN A LADDER-TYPE ELECTRIC FILTER

[75] Inventors: Tatsuo Ogawa; Junji Kawai, both of Nagoya, Japan

[73] Assignee: NGK Spark Plug Co., Ltd., Aichi, Japan

[ * ] Notice: The term of this patent shall not extend beyond the expiration date of Pat. No. 5,426,401.

[21] Appl. No.: 399,212

[22] Filed: Mar. 6, 1995

Related U.S. Application Data

[62] Division of Ser. No. 161,423, Dec. 6, 1993, Pat. No. 5,426,401.

[30] Foreign Application Priority Data

Dec. 4, 1992 [JP] Japan ..................... 4-350862

[51] Int. Cl.$^6$ ................ H03H 9/205; H03H 9/58
[52] U.S. Cl. .................. 333/187; 333/189; 333/188
[58] Field of Search ..................... 333/186–192

[56] References Cited

U.S. PATENT DOCUMENTS

| | | | |
|---|---|---|---|
| 4,353,045 | 10/1982 | Matsui et al. | 333/189 X |
| 4,639,698 | 1/1987 | Nishiki | 333/187 |
| 5,105,173 | 4/1992 | Itou | 333/205 X |
| 5,130,680 | 7/1992 | Nagai et al. | 333/188 X |
| 5,260,675 | 11/1993 | Ogawa et al. | 333/189 |
| 5,426,401 | 6/1995 | Ogawa et al. | 333/188 |

FOREIGN PATENT DOCUMENTS

| | | | |
|---|---|---|---|
| 0148418 | 8/1984 | Japan | 333/188 |
| 2254972 | 10/1992 | United Kingdom | 333/189 |

*Primary Examiner*—Benny Lee
*Assistant Examiner*—Darius Gambino
*Attorney, Agent, or Firm*—Larson and Taylor

[57] ABSTRACT

A method of adjusting a frequency response in a ladder-type electric filter having a pair of parallel resonators and a pair of strip-shaped series resonators arranged in a predetermined manner to form a fundamental filter circuit in which at least one of corner portions of each of the strip-shaped series resonators is beveled without changing its length L to regulate its resonance frequency so that the device can be stored within a case without displacing it from its proper position and held in contact with a contact at its node of vibration.

1 Claim, 6 Drawing Sheets

METHOD OF ADJUSTING A FREQUENCY RESPONSE IN A LADDER-TYPE ELECTRIC FILTER

This is a division of application Ser. No. 08/161,423 filed Dec. 6, 1993 now U.S. Pat. No. 5,426,401, issued 20 Jan. 1995.

BACKGROUND OF THE INVENTION

The present invention relates to a method of adjusting a frequency response of a ladder-type electric filter to be used for a filter circuit in a portable and mobile radiotelephony set or an automobile telephone set comprising series resonators and parallel resonators contained in a case to form a unit filter circuit to be mounted on a print circuit board as a component of a filter circuit having a given circuit configuration.

It is known that such a ladder-type electric filter comprises series resonators with electrodes one of which is connected to an input terminal and parallel resonators with electrodes one of which is grounded, the other electrode of each of the series and parallel resonators being connected to an output terminal. Known conventional ladder-type electric filters include those comprising square series and parallel resonators with sides that are approximately 5 mm long and designed to operate at a center frequency of 455 KHz, utilizing an contour vibration mode and those comprising circular series and parallel resonators having an diameter of approximately 5 mm to utilize a radial vibration mode for operation.

Recently, on the other hand, with the increasing demand for down-sized and lightweight wireless telecommunications equipment, the ladder-type electric filters are required to reduce their height to as small as 0.01 mm. Such a rigorous requirement, however, cannot be met by conventional filters comprising resonators that are arranged to a multilayer structure and put in a case.

In an attempt to provide a breakthrough to the above problem, there has been proposed a ladder-type electric filter which comprises a pair of square parallel resonators superimposed or vertically arranged one on the other to utilize a contour vibration mode, each parallel resonator being provided with electrodes on its upper and lower surface, the electrodes arranged on the interface being connected to a grounding terminal plate, and a pair of strip-shaped series resonators juxtaposed or horizontally,arranged side by side on the upper parallel resonator with an insulating plate interposed therebetween to utilize a longitudinal vibration mode, each series resonator having electrodes on its upper and lower surface, the electrodes arranged on the respective lower surfaces of the series resonators being connected to the corresponding lower surface electrode of the lower parallel resonator by way of a terminal plate, the upper surface electrode of one of the series resonators being connected to an input terminal plate, the upper surface electrode of the other series resonator being connected to the upper surface electrode of the upper parallel resonator by way of an output terminal plate, said components being contained in a case, the input, output and grounding terminal plates being provided with respective connector legs projecting out of the case for connection with external electric circuits. A filter having a configuration as described above has a reduced overall height when compared with conventional filters, because of the horizontal arrangement of the series resonator.

Japanese Utility Model Application No. 3-33539 also discloses a ladder-type electric filter with a reduced overall height comprising a pair of strip-shaped series resonators respectively arranged by a pair of parallel resonators.

In either case, it is appreciated that a pair of strip-shaped series resonators are the key to the reduction of the height of a ladder-type electric filter.

As described above, such a ladder-type electric filter is required to have an operating frequency that strictly adheres to a given value and the resonance frequencies of its strip-shaped series resonators need to be regulated in order to accommodate themselves to any discrepancy in the operating ,frequency of the filter that may be given rise to by inaccurate molding and other causes. A conventional technique for such regulation of frequency consists in cutting either of series resonators S1 and S2 along a shorter edge α as illustrated in FIG. 1 of the accompanying drawings in order to reduce its length and hence increase its resonance frequency.

FIG. 2 schematically illustrates the relationship between the length of a series resonator and its resonance frequency. As seen in FIG. 2, the resonance frequency of the series resonator is directly proportional to its length and their relationship can be represented substantially by a straight line. Thus, the resonance frequency of the series resonator can be regulated by modifying its length.

On the other hand, however, if the length of the series resonator is modified, it can be displaced, even if slightly, from its proper position in the case when it is inserted into the case so that its center (where the node of vibration is located) p2 may be misaligned with the location p1 of the corresponding raised contact point of the contiguous terminal plate to increase the insertion loss. This is a problem that adversely affects the stabilized operation of a parallel resonator.

It is therefore an object of the present invention to provide a method of adjusting the frequency of a ladder-type electric filter which is capable of overcoming the disadvantages involved in the proposed frequency adjusting methods for any conventional ladder-type electric filter.

Another object of the invention is to provide a ladder-type electric filter that is free from the above identified problem.

According to the present invention, the above first object is achieved by providing a method of adjusting the frequency of a ladder-type electric filter comprising parallel and series resonators arranged and connected to form a given fundamental filter circuit configuration, said series resonators being of strip-shaped, wherein the strip-shaped series resonators are partially obliquely cut at least one of corner portions of either of the resonators without changing its length to regulate the resonance frequency of the resonators.

After a series of experiments, it has been found that the resonance frequency of the strip-shaped series resonators is increased by beveling the corner portions of the respective resonator and the increase in the frequency is proportional to the extent of beveling.

By beveling the corner portions of the strip-shaped resonators, the length thereof is not affected at all and hence it can always be inserted into the corresponding chamber of the case without the risk of misalignment so that the corresponding raised contact point of the contiguous terminal plate securely touches the center of the resonators, which provides the node of vibration, ensuring an effective filtering operation.

The present invention will now be described by way of example with reference to the accompanying drawings.

DETAILED DESCRIPTION

Figure 1:
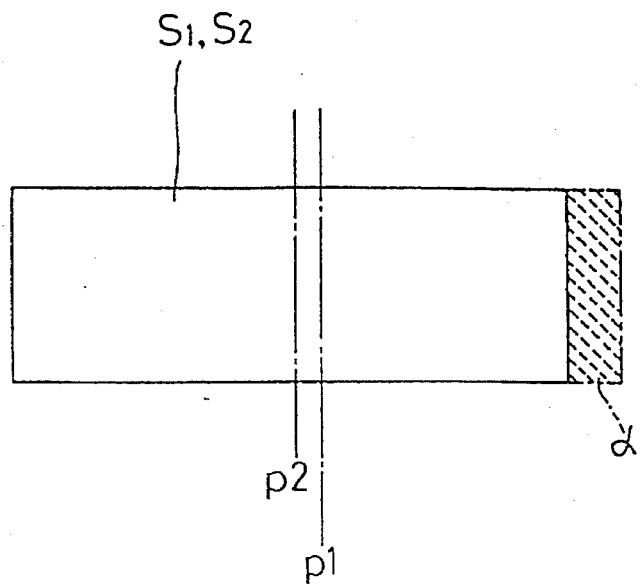
FIG. 1 is a plan view of a series resonator cut in a conventional manner.
Figure 2:
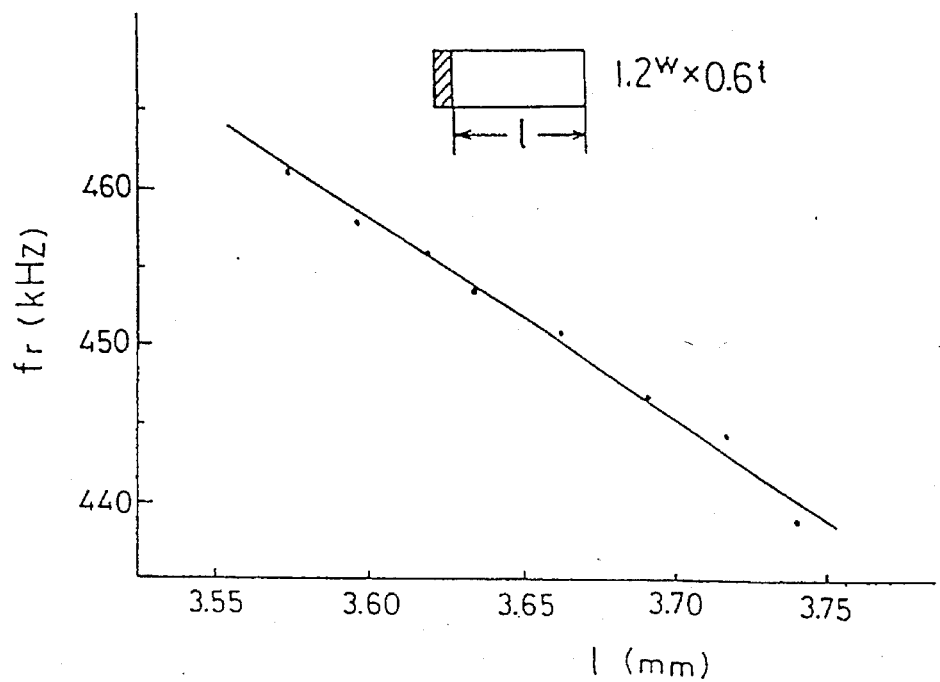
FIG. 2 is a graph showing the relationship between the resonance frequency of the series resonators and the length thereof obtained by cutting it according to a conventional technique of regulating the resonance frequency.
Figure 3:
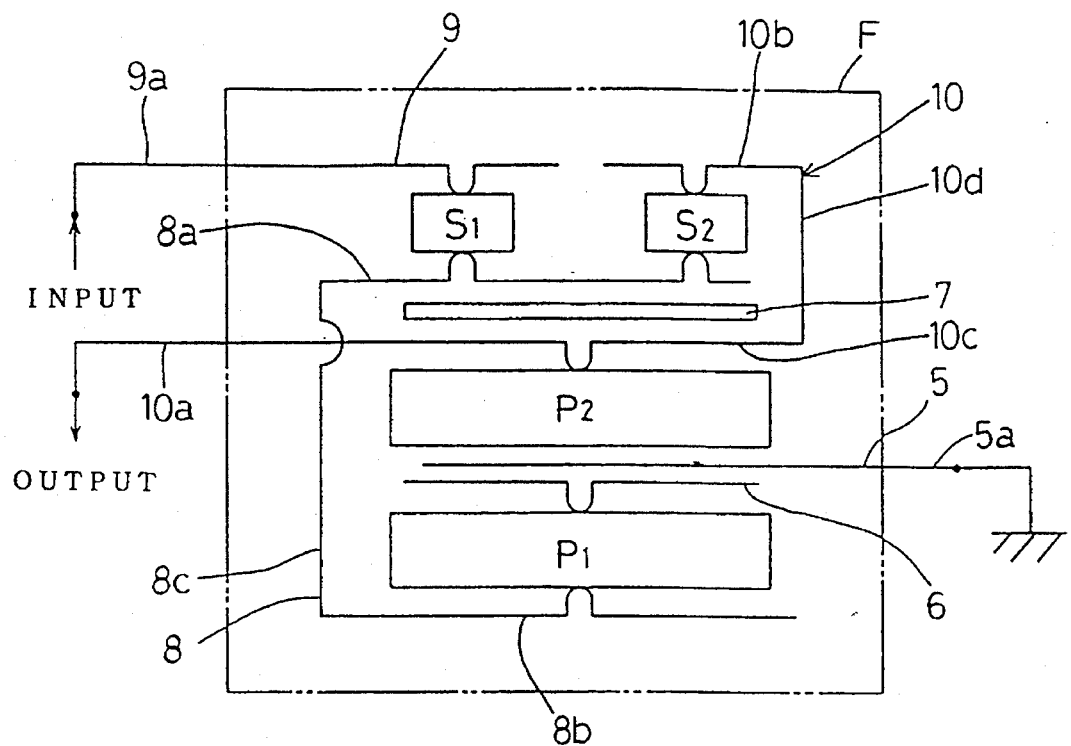
FIG. 3 is a schematic conceptual view of a ladder-type electric filter to which a method of the present invention is applied.

Referring to FIGS. 3 through 6 there is illustrated a preferred embodiment of a ladder-type electric filter to which a method of the invention is applied.

In the drawings, 1 denotes a thin and rectangular case made of a synthetic resin material and having an opening 2 provided on a front surface thereof. A pair of square parallel resonators P1 and P2 are superimposed or arranged in two layers within a lower portion of an inner space 3 of the case 1. A pair of strip-shaped series resonators S1 and S2 are arranged in chambers 4a and 4b formed side by side by arranging a partition, wall 4c in an upper portion of the space 3. The series resonators S1 and S2 are relatively thick whereas the parallel resonators P1 and P2 are relatively thin so that the former have a small capacitance relative to that of the latter. Also, the parallel resonators P1 and P2 are made square and their electrodes have a large surface area in order to utilize a contour vibration mode.

In a ladder-type electric filter having a configuration as described above, the principal resonance frequency of the strip-shaped series resonators S1 and S2 in the longitudinal vibration mode is made to agree with the center frequency of the filter. Additionally, the antiresonant frequency of the parallel resonators P1 and P2 in the contour vibration mode is made to agree with the center frequency of the filter as in the case of conventional filters of the type under consideration so that a desired unit filter circuit may be formed by the series resonators S1 and S2 and the parallel resonators P1 and P2.

In a ladder-type electric filter as described above, each of the series resonators S1 and S2 may typically be 1.5 mm wide, 3.8 mm long and 0.50 mm thickness whereas each of the parallel resonators P1 and P2 may normally have a square surface with 4.65 mm long edges and a thickness of 0.32 mm.

Figure 4:
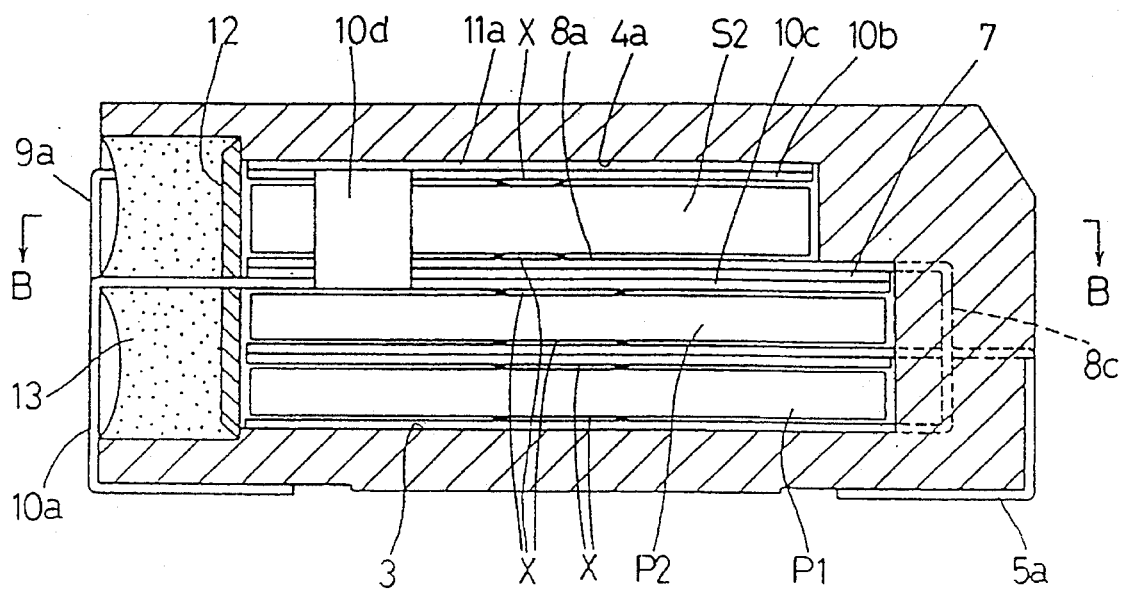
FIG. 4 is a longitudinal sectional view of a ladder-type electric filter whose frequency response is adjusted in accordance with the invention taken along line A—A in FIG. 5.
Figure 5:
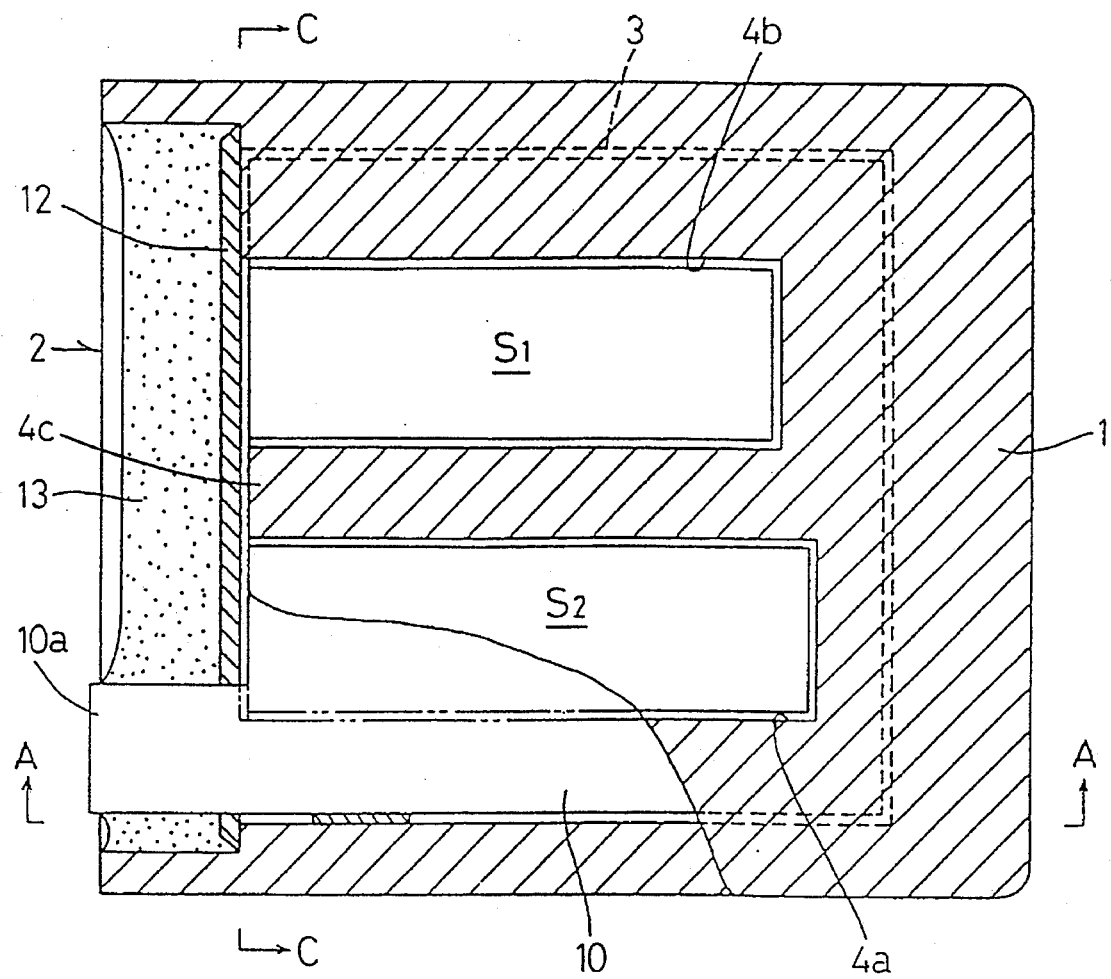
FIG. 5 is a sectional view taken along line B—B in FIG. 4.
Figure 6:
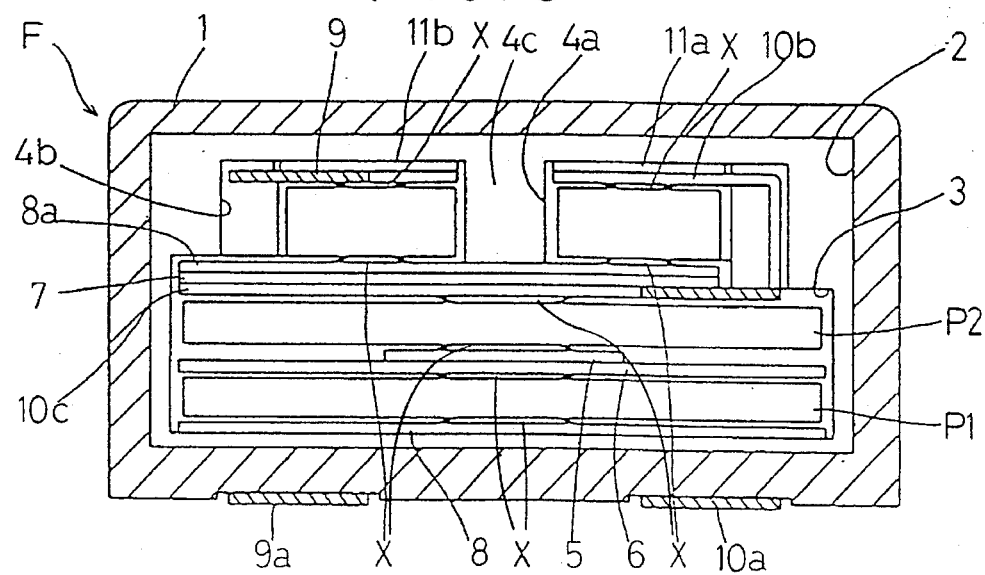
FIG. 6 is a sectional view taken along line C—C in FIG. 5.

Now, the components stored in the space 3 will be described in detail. The pair of square parallel resonators P1 and P2 are superimposed one on the other with a grounding terminal plate 5 and a square connector terminal plate 6 interposed therebetween, their electrodes arranged on the interface being connected to the grounding terminal plate 5. An end of the grounding terminal plate 5 is extended to form a connector leg 5a. The square connector terminal plate 6 is arranged between the grounding terminal plate 5 and the parallel resonator P1. The connector leg 5a is extened out of the case 1 as shown in FIG. 4 when the case 1 is produced by molding.

The strip-shaped series resonators S1 and S2 designed to utilize a longitudinal vibration mode are horizontally arranged side by side on the upper parallel resonator P2 with an insulating plate 7 and a terminal strip 8a of a connector terminal plate 8 interposed therebetween. These series resonators S1 and S2 are specifically positioned in the respective storage chambers 4a, 4b formed side by side on the upper portion of the space 3. The connector terminal plate 8 comprises a pair of terminal strips 8a and 8b arranged in parallel with each other and connected with each other by a connector section 8c, the terminal strip 8b being disposed under the lower parallel resonator P1 in such a manner that the lower surface electrodes of said series resonators S1 and S2 are connected with their counterpart of the parallel resonator P1 by way of the connector terminal plate 8. The connector section 8c is buried in the case at the time of molding.

An input terminal plate 9 is arranged on the upper surface electrode of the series resonator S1 and is provided with a connector leg 9a projecting out of the case 1 through the opening 2 from an end thereof. Thus, the upper surface electrode of the series resonator S1 can be connected to an external input circuit.

The upper surface electrodes of the series resonator S2 and the parallel resonator P2 are electrically connected with each other by an output terminal plate 10, which also is provided with a connector leg 10a projecting out of the case 1 through the opening 2 from an end thereof so that the upper surface electrodes of the series resonator S1 and the parallel resonator P2 can be connected to an external output circuit.

Additionally, buffer plates 11a and 11b are respectively arranged between ceiling or upper inner wall of the case 1 and the input and output terminal plates 9 and 10.

The terminal plates are provided with contacting protuberant portions X in order to ensure electrical connection with the resonators P1, P2, S1 and S2, these contacting protuberant portions X being so located that each of them provides a node of vibration on the corresponding one of the resonators.

The case 1 of the above described embodiment is formed by molding integrally with the grounding terminal plate 5 and the connector terminal plate 6. Then, the components are inserted into the case 1 through the opening 2 to place them in position with the connector legs 9a and 10a projecting outward through the opening 2. Thereafter, a plate 12 is fitted in the opening 2 and secured there by injecting a sealing resin material 13 such as epoxy resin to produce a finished ladder-type electric filter. The connector legs a and 10a and the connector leg 5a of the grounding terminal plate 5 are bent twice along the case 1 so that their free ends are positioned on the bottom of the case 1.

Thus, the ladder-type electric filter F has its input terminal plate 9, output terminal plate 10 and grounding terminal plate 5 partly exposed to the outside under the bottom so that it may be incorporated into a filter circuit simply by soldering and electrically connecting the exposed ends of the terminal plates to the associated circuit portions provided on a printed circuit board not shown.

Since the strip-shaped series resonators S1 and S2 are horizontally arranged side by side on the parallel resonator P2, the overall height of the ladder-type electric filter unit is significantly reduced as compared with a conventional filter unit of the type.

The resonance frequency of each of the series resonators S1 and S2 of a ladder-type electric filter of the type under consideration is required to strictly agree with a given value and therefore their frequencies need to be regulated in order to accommodate themselves to any discrepancy in the operating frequency of the filter that may be given rise to by inaccurate molding and other causes.

Since the space for containing such series resonator is designed to have a given length, the contact point X of a terminal plate contiguous to the series resonator S1 or S2 may inevitably be shifted relative to the latter if the length of the latter is modified by cutting it along one of its shorter edges. While the center of each of the series resonators S1 and S2 provides its node of vibration, the relative displacement of the contact point X and the center of the resonator can significantly increase the insertion loss and adversely affect the efficiency of the filter.

Figure 7:
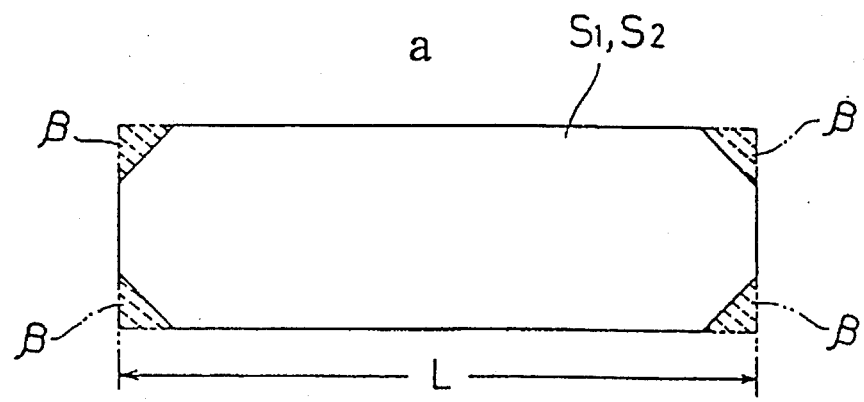
FIGS. 7-a, 7-b and 7-c are plan views showing different modes of beveling the series resonators in the present invention.
Figure 7:
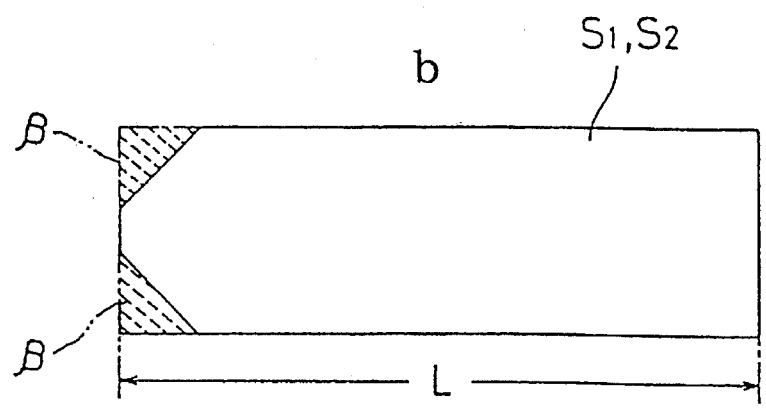
Figure 7:
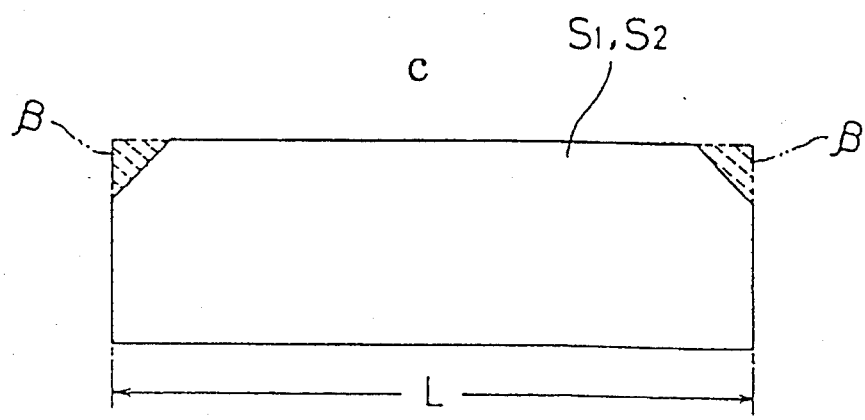

FIGS. 7-a, 7-b and 7-c illustrate three possible alternatives for modifying the resonance frequency of each of the resonators S1 and S2. In FIG. 7-a, all the four corner portions β of each of the series resonators S1 and S2 are beveled by 45° whereas only a pair of corner portions β located at one end of the resonator are beveled by 45° in FIG. 7-b and alternatively a pair of corner portions β located at the opposite ends of the resonator are beveled by 45° in FIG. 7-c. In any of the above alternatives, it is appreciated that the lengths of the series resonators S1 and S2 are not changed. Therefore, the respective positional relationships between the containing chambers 4a and 4b and the series resonators S1 and S2 are not altered and consequently each contacting protuberant portion X of the terminal plates contiguous to the series resonator S1 or S2 is constantly aligned with the center of the resonator where the node of vibration is located. Thus, the operation of regulating the resonance frequency of the device does not involve any insertion loss and ensures a desired filtering performance.

Figure 8:
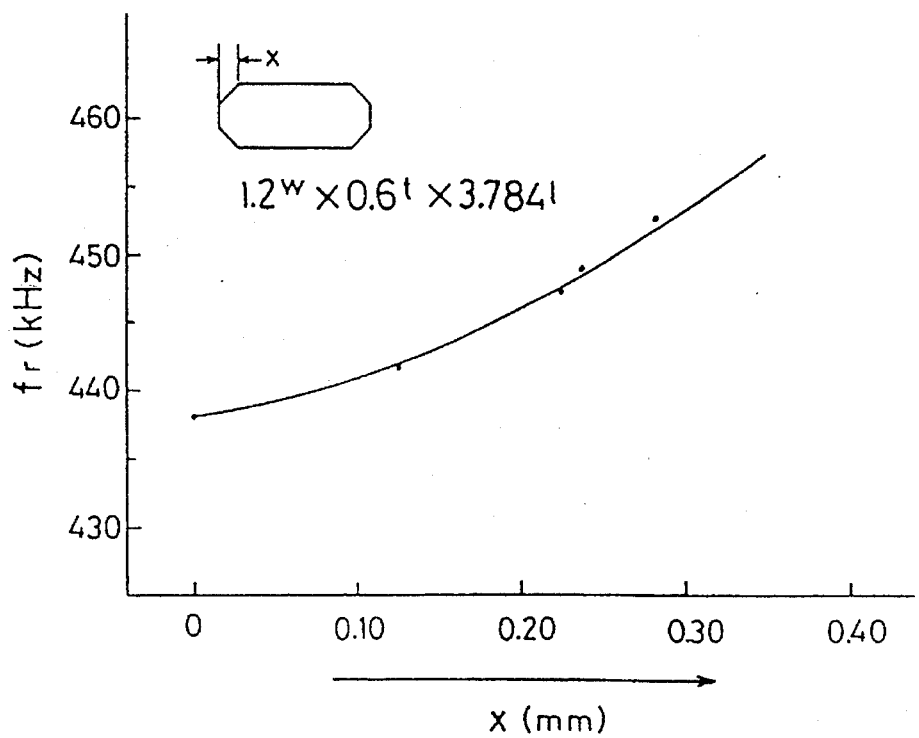
FIG. 8 is a graph showing the resonance frequency of the series resonators when they are beveled at four corner portions on both ends thereof in accordance with one embodiment of the present invention.
Figure 9:
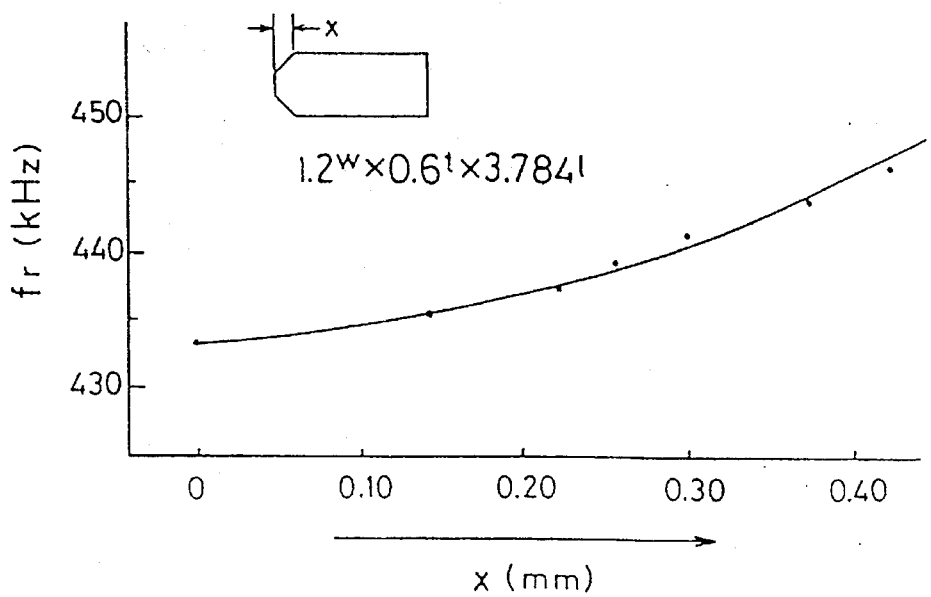
FIG. 9 is a graph similar to FIG. 8 showing the resonance frequency of the series resonators when they are beveled at both corners on one end thereof in accordance with another embodiment of the present invention.
Figure 10:
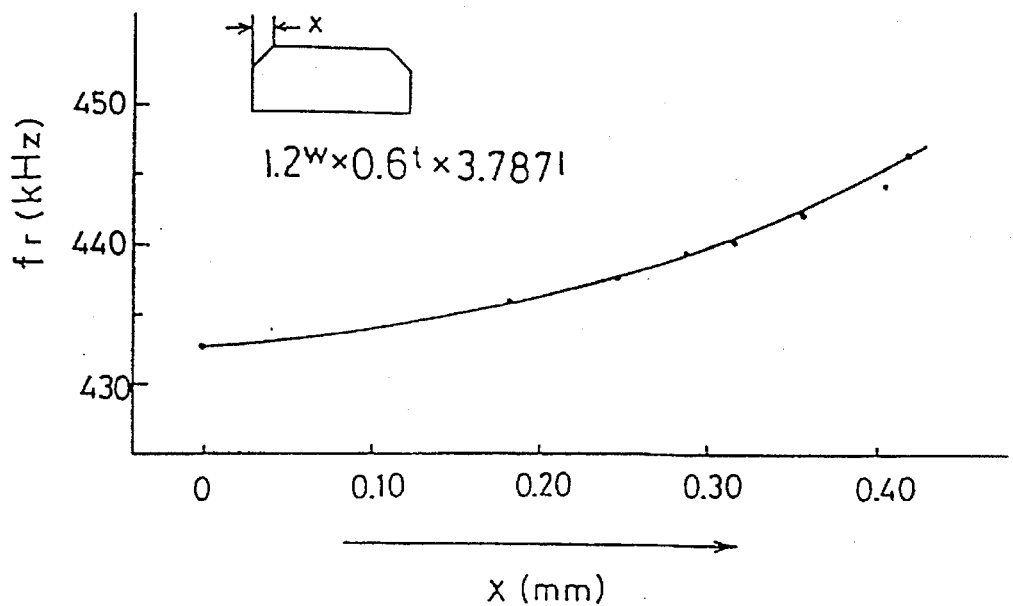
FIG. 10 is a graph similar to FIG. 8 showing the resonance frequency of the series resonators when they are beveled at one corner portion on both ends thereof in accordance with a further embodiment of the present invention.
Figure 11:
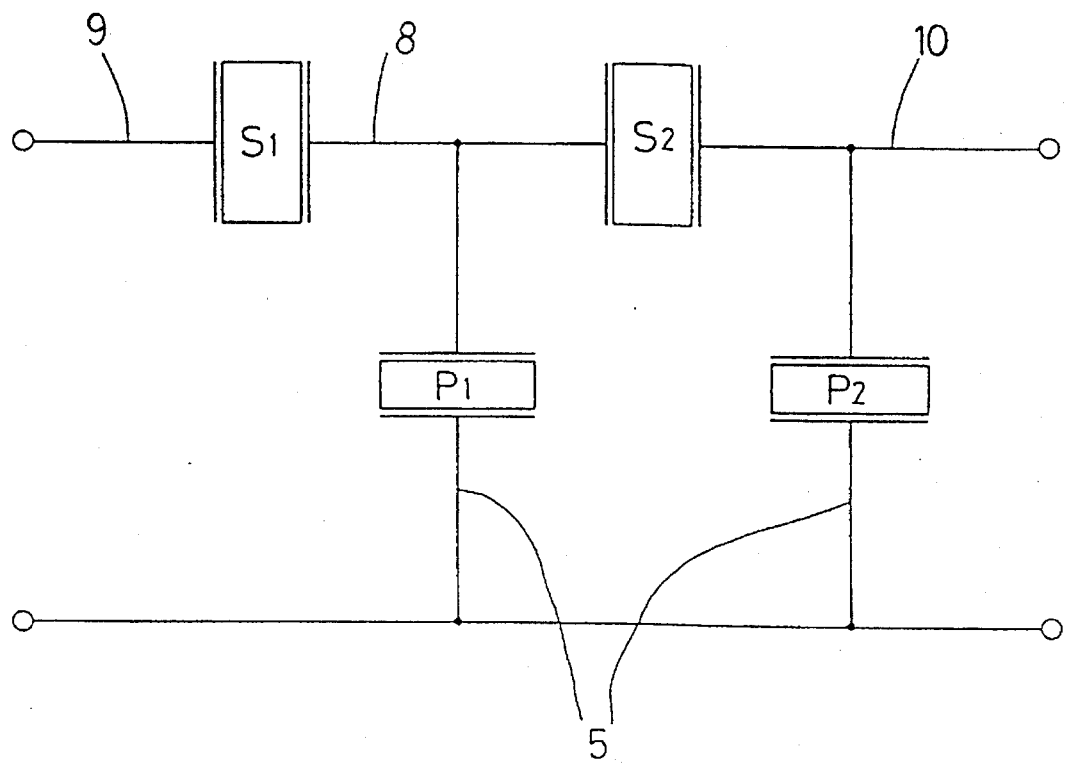
FIG. 11 is a circuit diagram of a ladder-type electric filter to which the method of the present invention is applicable.

FIGS. 8, 9 and 10 illustrate how the resonance frequency of each series resonator may be changed by the extent of beveling, that is the fact that the resonance frequency of each of the series resonators S1 and S2 of a ladder-type electric filter can be increased by beveling one or more corner portions of each series resonator by 45°. In the graphs, the transverse axis represents the extent of beveling when the corner portions of each series resonator are evenly beveled at 45°. As seen in these graphs, the more beveled the greater is the resonance frequency of the series resonator. FIG. 8 shows the relationship between the extent of beveling and the increase in the resonance frequency when all the four corner portions of the resonator are evenly beveled as shown in FIG. 7-a. whereas FIGS. 9 and 10 illustrate the corresponding relationships when two corner portions at the opposite ends of a short and long horizontal edges are evenly beveled respectively as shown in FIG. 7-b and c. In the graphs, x represents the length of the edge generated by beveling which is obtained by averaging the values measured on the samples in the experiments.

While the parallel resonators P1 and P2 in the above illustrated embodiment are strip-shaped rectangular devices that utilize a longitudinal vibration mode, they may alternatively be square devices like series resonators S1 and S2 that utilize a contour vibration mode. The angle of beveling or obliquely cutting one or more corner portions of the series resonators S1 and S2 may not necessarily be 45° and may alternatively be 30°, 60° or any other appropriate angle or, still alternatively, they may be arcuately beveled with a given radius of curvature.

As is described above in detail, the present invention is based on the fact that the resonance frequency of each of the series resonators S1 and S2 of a ladder-type electric filter can be increased and regulated by beveling or obliquely cutting one or more corner portions thereof. With such beveling or obliquely cutting, the length L of each of the series resonators is not modified and therefore its node of vibration can be always aligned with the corresponding contacting point X of the contiguous terminal plate to eliminate any insertion loss due to the resonance frequency regulation. Thus, the present invention provides an excellent method for regulating the resonance frequency of a strip-shaped series resonator.

It is to be understood that the illustrated and described embodiments are only illustrative of the application of the principles of the present invention. Numerous modifications and alterations may be made by those skilled in the art without departing from the spirit and scope of the invention, and the appended claims are intended to cover such modifications and alterations.

We claim:

1. A ladder type electric filter comprising a pair of parallel resonators superimposed with each other, a pair of rectangular series resonators juxtaposed on the upper one of said paired parallel resonators, terminal means for connecting said parallel and series resonators to form a predetermined filter circuit unit, and a casing for containing said parallel and series resonators and terminal means.

* * * * *